United States Patent [19]

Vary

[11] Patent Number: 4,623,980

[45] Date of Patent: Nov. 18, 1986

[54] METHOD OF PROCESSING ELECTRICAL SIGNALS BY MEANS OF FOURIER TRANSFORMATIONS

[75] Inventor: Peter Vary, Herzogenaurach-Niederndorf, Fed. Rep. of Germany

[73] Assignee: Te Ka De Felten & Guilleaume Fernmeldeanlagen GmbH, Nuremberg, Fed. Rep. of Germany

[21] Appl. No.: 709,358

[22] Filed: Mar. 8, 1985

Related U.S. Application Data

[63] Continuation of Ser. No. 374,606, Apr. 30, 1982, abandoned.

[30] Foreign Application Priority Data

May 9, 1981 [DE] Fed. Rep. of Germany ....... 3118473

[51] Int. Cl.[4] ..................... H03H 17/02; H03H 17/06
[52] U.S. Cl. .................................. 364/724; 364/723; 379/410; 380/6; 380/38
[58] Field of Search ............ 179/1.5 R, 1.5 FS, 170.2, 179/1.5 M; 364/723, 724

[56] References Cited

U.S. PATENT DOCUMENTS

| | | | |
|---|---|---|---|
| 4,020,332 | 4/1977 | Crochiere et al. ................... | 364/723 |
| 4,025,721 | 5/1977 | Graupe et al. .......................... | 381/47 |
| 4,101,738 | 7/1978 | Bellanger et al. .................... | 364/724 |
| 4,188,506 | 2/1980 | Schmid et al. .................... | 179/1.5 R |
| 4,216,354 | 8/1980 | Esteban et al. ....................... | 381/31 |
| 4,281,318 | 7/1981 | Candy et al. ................. | 340/347 DD |
| 4,302,631 | 11/1981 | Shenoi et al. ......................... | 179/1.1 |
| 4,316,282 | 2/1982 | Macina .............................. | 370/50 X |
| 4,334,128 | 6/1982 | Snijders ............................ | 179/170.2 |
| 4,389,538 | 6/1983 | White ............................. | 364/724 X |
| 4,393,456 | 7/1983 | Marshall, Jr. ....................... | 364/724 |

FOREIGN PATENT DOCUMENTS

| | | |
|---|---|---|
| 1273002 | 7/1968 | Fed. Rep. of Germany . |
| 2749132 | 6/1978 | Fed. Rep. of Germany . |
| 3032397 | 3/1982 | Fed. Rep. of Germany . |

OTHER PUBLICATIONS

Bellanger, M. G., et al (II), "Interpolation, Extrapolation, and Reduction of Computation Speed in Digital Filters," *IEEE Transactions on Acoustics, Speech, and Signal Processing*, vol. ASSP-22, No. 4, Aug. 1974, 231-5.

Crochiere, R. E. et al., "Interpolation and Decimation of Digital Signals: A Tutorial Review," *Proceedings of the IEEE*, vol. 69, No. 3, Mar. 1981, 300-331.

European Patent Search Report 65210, published Sep. 5, 1984, based on application No. EP 82103859.

Bellanger, M. G. et al (III), "Digital Filtering by Polyphase Network: Application to Sample-Rate Alteration and Filter Banks," *IEEE Trans.*, vol. ASSP-24, No. 2, Apr. 1976, 109-114.

Bellanger, M. G. et al (IV), "TDM-FDM Transmultiplexer-Digital Polyphase and FFT," *IEEE Trans. on Communications*, vol. COM-22, No. 9, Sep. 1974, 1199-1205.

Heute, Ulrich, et al., "A Digital Filter Bank with Polyphase Network and FFT Hardware: Measurements and Applications," *Signal Processing*, vol. 3, No. 4, Oct. 1981, 307-319.

Boll, S. F., "Suppression of Acoustic Noise in Speech Using Spectral Subtraction," *IEEE Trans.*, vol. ASSP-27, No. 2, Apr. 1979, 113-120.

Lim, J. S., "Evaluation of a Correlation Subtraction Method for Enhancing Speech Degraded by Additive White Noise", *IEEE Trans.*, vol. ASSP-26, No. 5, Oct. 1978, 471-472.

Vary, P., "A Short-Time Spectrum Analyzer with Polyphase-Network and DFT," *Signal Processing*, vol. 2, No. 1, Jan. 1980, 55-65.

*Primary Examiner*—Jerry Smith
*Assistant Examiner*—Clark A. Jablon
*Attorney, Agent, or Firm*—Michael J. Striker

[57] ABSTRACT

In order to upgrade input signals for further processing, one or more of the input signals is split up by a decimating technique into spectral component signals which are processed according to the desired purpose and recombined by means of an interpolation technique into an output signal. In this manner a digital filtering device can be selectively employed for achieving an arbitrary combination of simultaneous filtering, signal improvement, echo or feedback compensation, or signal masking of the input signals.

6 Claims, 5 Drawing Figures

METHOD OF PROCESSING ELECTRICAL SIGNALS BY MEANS OF FOURIER TRANSFORMATIONS

This application is a continuation of application Ser. No. 374,606, filed Apr. 30, 1982, now abandoned.

BACKGROUND OF THE INVENTION

The present invention relates to a method of processing or upgrading electrical signals by means of a digital filtering system using Fourier transformation.

This kind of signal preparation relates to linear filtering or to signal improvement or to echo or feedback cancellation or to signal masking of an arbitrary combination of input signals. The preparation of signals in a digital filtering device is performed in discrete time intervals.

A discrete linear filtering operation can be expressed in a time interval by a discrete folding of a train of pulses u(k) with a pulse response h(k) of the filter, that is, by an equation $$y(k) = \sum_{K=0}^{k} u(k - K) \cdot h(K) \quad (1)$$

or in a frequency range by the multiplication of the input spectrum $U(\Omega)$ by a transfer function $H(\Omega)$, i.e. by an equation $$Y(\Omega) = U(\Omega) \cdot H(\Omega) \quad (2)$$

whereby the frequency scale is compared with the scanning frequency $f_A (\Omega = 2\pi \cdot f/f_A)$.

Signal improvement is desired when an additive interference is superposed to the signal. This kind of interference can be caused by the acoustic background noise or due to electrical interference in a transmission channel. Provided that the stationary state of the interference is weak, then by means of a continuous parameter identification the stationary intervals, that is pauses in speech, and thus the parameters of the interference can be recognized. By means of the resulting parameters the filter coefficients of an optimum filter are computed (U.S. Pat. No. 4,025,721). This optimum filter minimizes the remaining errors. Another time-domain filtering method is known from German patent publication DE-AS 27 49 132, in which an adaptive, digital transversal filter is employed for the signal improvement, the filter coefficients being set according to a gradient algorithm, and the resulting evaluation signal should represent correct reproduction of the original signal. Still another known method for improvement of signals is based on the so-called spectral subtraction technique. In this prior-art method, the instantaneous or short-time spectrum of the disturbed signal is determined according to its magnitude (or power) and phase by means of a FFT spectral transformation (fast Fourier transform). The magnitude or value (or power) spectrum is corrected substantially by subtracting an estimated amount (power) spectrum of the interference. Subsequently the phase of the disturbed signal is added, and an inverse FFT is effected. This known method is disclosed for example in an article in IEEE-Transactions, Volume ASSP-26, 1978, pp. 471–472 or Volume ASSP-27, 1979, pages 113–120.

The problem of echo or feedback occurs for example in telephone transmission. Due to reflections on branching circuits, interference echoes are produced which are to be cancelled by adaptive filters. An adaptive filter can also be employed for suppressing feedback in a so-called loud telephone.

For the purpose of signal masking or extraction, the signal spectrum can be split into several frequency bands, and the latter can be mutually exchanged or brought into a reverse position according to their frequencies. In this manner a transmission channel can be ensured against unauthorized wiretapping (German patent publication DE-AS 1 273 002).

SUMMARY OF THE INVENTION

A general object of the present invention is to provide an improved digital filtering system which is very low in cost and in which the various aforedescribed kinds of signal preparation can be selected in an arbitrary combination.

In keeping with these objects, and others which will become apparent hereafter, one feature of the invention resides in a method in which one or more input signals are split up by means of a decimating technique into spectral partial signals, the partial signals being then processed by any combination of filtering, signal improvement, echo or feedback cancellation or signal masking, into prepared partial signals suitable for upgrading the input signals, and thereafter the prepared partial signals are interpolated in an output signal.

In contrast to prior-art methods, the method of this invention brings about a substantial improvement of the functionality and also a considerable reduction in costs for the component parts.

The novel features which are considered characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Figure 1:
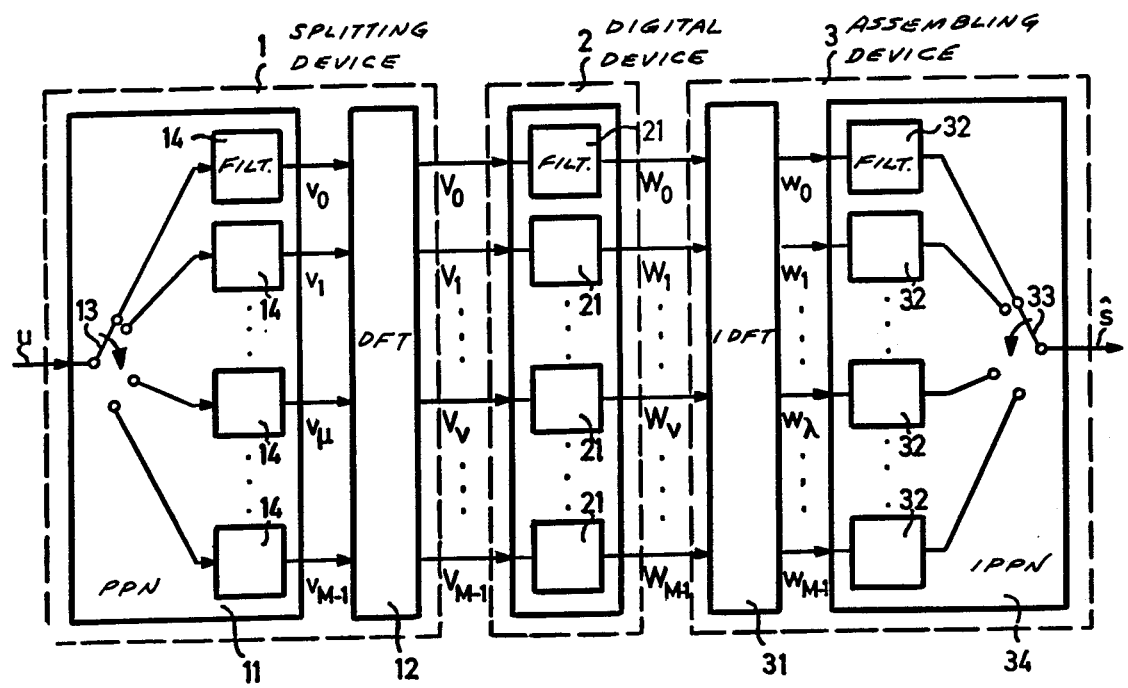
FIG. 1 is a schematic block diagram of a digital filtering device according to this invention.

The digital filtering device according to FIG. 1 includes a digital splitting device 1, by means of which an input signal u is split up into spectral partial signals $V_\nu$ in the form of complex low-pass signals. Index $\nu$ indicates a track parameter (channel) so that for example $V_\nu$ indicates a spectral component signal for the $\nu^{th}$ channel. All these spectral component signals $V_\nu$ are processed in a digital device 2 in which, according to the desired application, the input signal u is processed in such a manner that an arbitrary combination of filtering and signal improvement, or of echo and feedback cancellation, or of a signal masking or extraction effect, is obtained. It has been found advantageous when, in spite of different applications, the structure of the digital filtering device remains the same. The output signals $W_\nu$ of the device 2 are applied to an assembling device 3 where the signals $W_\nu$ are interpolated in an output signal s in such a manner that this output signal is prepared for the desired application, for example filtering.

For filtering and signal improvement of the input signal u, which consists for example of a speech signal s and an additively superposed interference signal n, the input signal is split up in the device 1 into frequency bands. The device 1 is for example a bank of filters known for example from an article in Signal Processing, Vol. 2, 1980, pp. 55-65. This filtering bank includes a so-called polyphase network 11 which is connected to an FFT processor 12. The operation of such a splitting device 1 is expressible by M equidistant channels, each having a constant bandwidth. At each of the outputs of the device 1, a complex low-pass signal $V_\nu$ is produced according to a quadrature bandpass filtering with conversion in the low-pass condition and with simultaneous time base reduction. This time rate reduction or decimation of a scanning frequency for the input signal u is symbolically expressible by means of a rotary switch 13 which has its contacts connected to the inputs of respective stages of the digital filtering device. In real circuitry, the switch can be replaced by an input storage. In this manner, the digital filtering device can operate with the theoretically lowest clock rate and the expenditures for the computation circuitry is reduced.

The polyphase network (PPN) 11 includes, depending on the number M of the spectral active signals $V_\nu$, a series of partial filters 14 the filtering coefficients of which are adjustable. The selection of the coefficients of the partial filter 14 is expressible by the selection of coefficients of a recursive or nonrecursive prototype-lowpass having a pulse response $h_{TP}$. The spectral dissocation is determined by the frequency response of the prototype-lowpass. The output signals, namely the filtered component signals $v_\mu$ of each partial filter 14 in the polyphase network 11 are expressible by the following equation:

$$v_\mu(p \cdot M) = \sum_{i=0} u(p \cdot M - i \cdot M + \mu) \cdot h_{TP}(i \cdot M - \mu) \quad (3)$$

As seen from the equation (3), the computation results in discrete time points $k = p \cdot M$ (=0, 1, 2, ... ), corresponding to the rate reduction by the factor M (decimation). In general, the rate reduction can also be made by a factor of $r \ne M$.

The filtered component signals $v_\mu$ are transformed by means of the computation process of the discrete Fourier transformation in the DFT processor 12 into complex lowpass signals $v_\nu$. For the complex lowpass signals $V_\nu$ the following equation applies:

$$V_\nu(p) = \sum_{\mu=0}^{M-1} v_\mu(p \cdot M) \cdot e^{-j\frac{2\pi}{M}\mu\nu} \quad (4a)$$

In this computation, the discrete Fourier transform does not have the significance of a spectral transformation, but represents a complex computational formula for the creation of linear combinations of the time signals $v_\mu$. By applying the equation (3) to the equation (4a), there will result after the transformation taking into account the periodicity of the complex weight factors the equation $$V_\mu(p) = \sum_{K=0}^{k=p\cdot M} u(k - K) \cdot e^{-j\frac{2\pi}{M}\cdot\mu\cdot(k-K)} \cdot h_{TP}(K); \; k = p \cdot M \quad (4b)$$

There are involved complex low-pass signals which are expressible by a complex modulation (spectral shift by the amount of $2\pi\mu/M$) of the input signal u, low-pass filtering and time rate reduction.

Each of the complex low-pass signals $V_\nu$ can be subjected to an adaptive, complex filtering in order to reduce noise. In special cases, this filtering can also be performed as a level control. By means of the level control, preferably by an adaptive level control, the real and imaginary components can be controlled independently of one another. For this purpose, there are provided filtering subunits 21 in each digital device 2, by means of which a common level factor $c_\nu$ is selectable for each channel, for example. The following equations apply for the complex output signals $W_\nu$ of respective devices 21:

$$W_\nu(p) = c_\nu(p) \cdot V_\nu(p)$$

and for a level factor $c_\nu$, for example $$c_\nu = \sqrt{1 - \alpha_o \cdot \frac{E_1\{|N_\nu|^2\}}{E_2\{|V_\nu|^2\}}} \quad (6)$$

or $$c_\nu = 1 - \sqrt{\alpha_o \cdot \frac{E_1\{|N_\nu|^2\}}{E_2\{|V_\nu|^2\}}} \quad (7)$$

It should be noted that equations (6) and (7) are specific examples for demonstration only. In general $c_\nu$ is a function of $E_1$ and $E_2$.

The spectral component signals $V_\nu$ are always composed of the signal component $S_\nu$ and interference components $N_\nu$ according to the equation $$V_\nu = S_\nu + N_\nu$$

$E_1$ and $E_2$ are short-time or momentary expectation values with the significance of momentary powers. The momentary expectation values $E_1$ and $E_2$ are set up for example through formation of a running average value (rectangular window perhaps with differing window lengths) or according to the following equation (exponential window)

$$E_i\{x\} = G_i(p) = (1-\alpha_i) \cdot G_i(p-1) + \alpha_i \cdot x; \; 0 \le \alpha_i \le 1$$

Constants $\alpha_i$ (i=0, 1, 2) are employed for weighting. A linear filtering effect will result when the complex low-pass signals $V_\nu$ are constant and weighted differently.

The short-time or momentary power of interference signal $N_\nu$ is computed in the speech pauses, the time constants of the average value formation being controlled by means of a speech pause detector.

The constants $\alpha_i$ or the window lengths can be selected under the supposition of a stationary interference in such a manner that, in each channel, the momentary powers of the complex time signals $W_\nu$ correspond, after the completion of the level control, to the momentary powers of the undisturbed signal components $S_\nu$.

The resulting complex signals $W_\nu$ are fed into an IDFT processor 31 which is connected to the input of a polyphase network 34. In the FFT processor the signals $W_\nu$ are subjected to an inverse operation and are assembled through the inverse polyphase filtering in partial filters 32 into an output signal $\tilde{s}$. In this operation, there is employed so-called interpolation technique by means of which the timing frequency of the scanning values is again increased to the original timing frequency for the input signal u. This time rate or cycle increase at the output of the digital filtering device of this invention, according to FIG. 1, is expressed by means of a rotary switch 33. The inverse operations can be described by the following equations:

$$w_\lambda(p \cdot M) = \frac{1}{M} \sum_{\nu=0}^{M-1} W_\nu(p) \cdot e^{+j\frac{2\pi}{M} \cdot \nu \cdot \lambda} \tag{10}$$

$$x_\lambda(p \cdot M) = \sum_i w_\lambda((p - i) \cdot M) \cdot h_{TP}(i \cdot M + \lambda) \tag{11}$$

$$\tilde{s}(p \cdot M + \lambda) = x_\lambda(p \cdot M) \tag{12}$$

In comparison with the method of spectral subtraction, the digital filtering device according to the present invention can be realized with less expense and requires a reduced computation time. The adjoining channels are decoupled from one another when the prototype lowpass impulse response $h_{TP}$ is suitably selected. By setting short blocking lengths (for example M=32) and using a minimum phase filtering, very small delay times are achievable.

Since the spectral component signals $V_\nu$ are separable according to their real and imaginary components, it is possible to use for example adaptive level control separately for the real and the imaginary component. Both recursive and nonrecursive prototype filters can be used as the partial filters 14 or 32. The method of this invention enables a highly effective noise reduction with a minimum distortion of the speech signal, and a small number M of channels.

Figure 2:
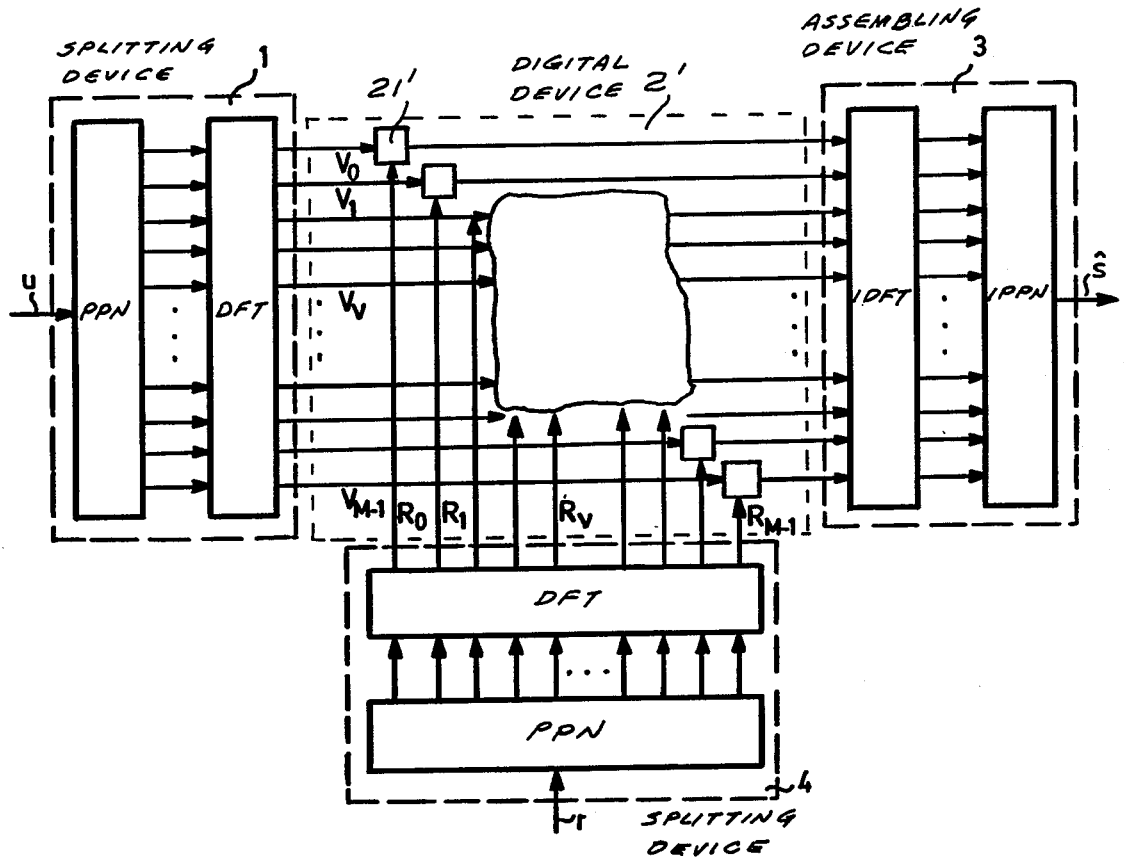
FIG. 2 is another embodiment of the digital filtering device, including an additional reference signal.

FIG. 2 illustrates another embodiment of this invention, namely the digital filtering device 2' adapted for the case where a reference signal r correlated with the interference n is available. In a further device 4 corresponding functionally to the device 1 of FIG. 1, an input signal, in this embodiment a reference signal r, is split up by means of the decimating technique into spectral component signals $R_\nu$. The common level factor $c_\nu$ can for example be computed from the following equation for the special case where the real component, adaptive level control in each channel is employed:

$$c_\nu = 1 - \sqrt{\alpha_o \cdot \frac{E_1\{|R_\nu|^2\}}{E_2\{|V_\nu|^2\}} \cdot |H_\nu|^2} \tag{13}$$

The mean square transfer function $|H_\nu|^2$ is determined from the quotients of the momentary powers of the interference signal $N_\nu$ (see equation (8)) and from the reference signal $R_\nu$ in the pauses of the speech. A substantial difference in comparison with prior-art methods is the stationary condition of the noise. Even in case of a weak stationary condition of the noise, a highly effective noise reduction with a minimum distortion of the speech signal can be achieved.

Figure 3:
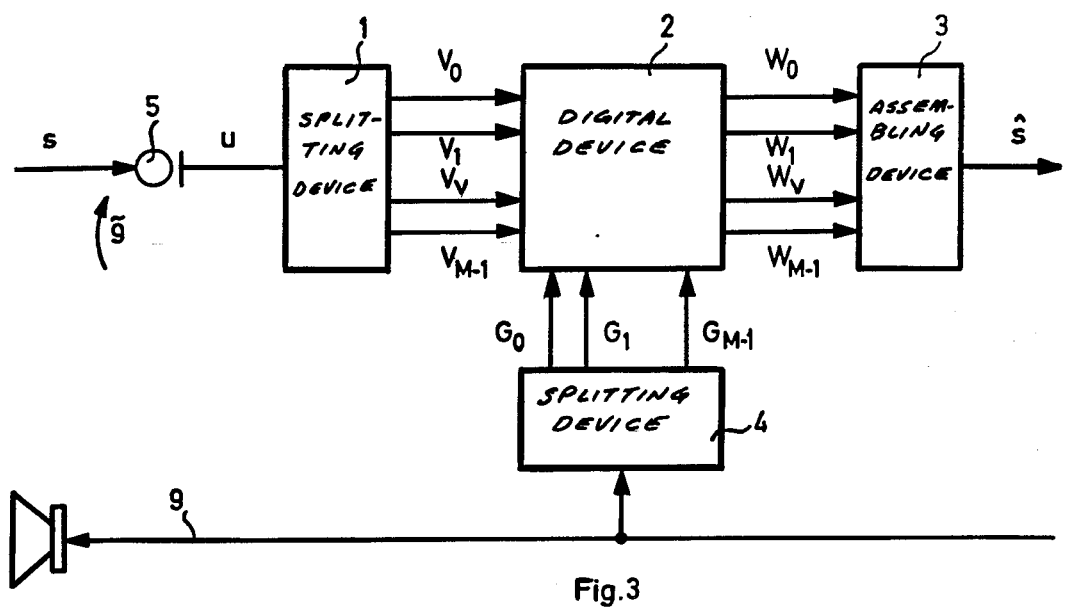
FIG. 3 is a block circuit diagram of a digital filtering device for use in echo and feedback cancellation in a loud telephone.

FIG. 3 ilustrates the application of the digital filtering device 2' according to this invention for echo or feedback cancellation. In a microphone 5, an echo speech signal $\tilde{g}$ is additively superposed to the speech signal s. From the resulting microphone signal $(s+\tilde{g})$ an evaluation signal $\hat{s}$ is formed in the digital filtering device, by employing the steps of the method of this invention; splitting up the microphone signal into spectral component signals by means of a decimating technique; processing these spectral component signals for example by means of real-value adaptive level control; and interpolating the processed spectral component signals in an output signal.

Similarly as in the example according to FIG. 2, a reference signal is used for deriving the adaptive, real component level factors. The reference signal in this case is identical with the signal g from the loudspeaker. In the pause of the speech the equation $V_\mu = \tilde{G}_\nu$ applies with s=0 or u=$\tilde{g}$. Through measuring the momentary powers of the spectral component signals $\tilde{G}_\nu$ and $G_\nu$ the mean square transfer function is defined as follows:

$$|H_\nu|^2 = \frac{E_3\{|\tilde{G}_\nu|^2\}}{E_4\{|G_\nu|^2\}} \tag{14}$$

It is also possible to employ for the measurement before the beginning of the speech a test signal which is for example a white noise or a multifrequency signal, instead of the loudspeaker signal g.

Figure 4:
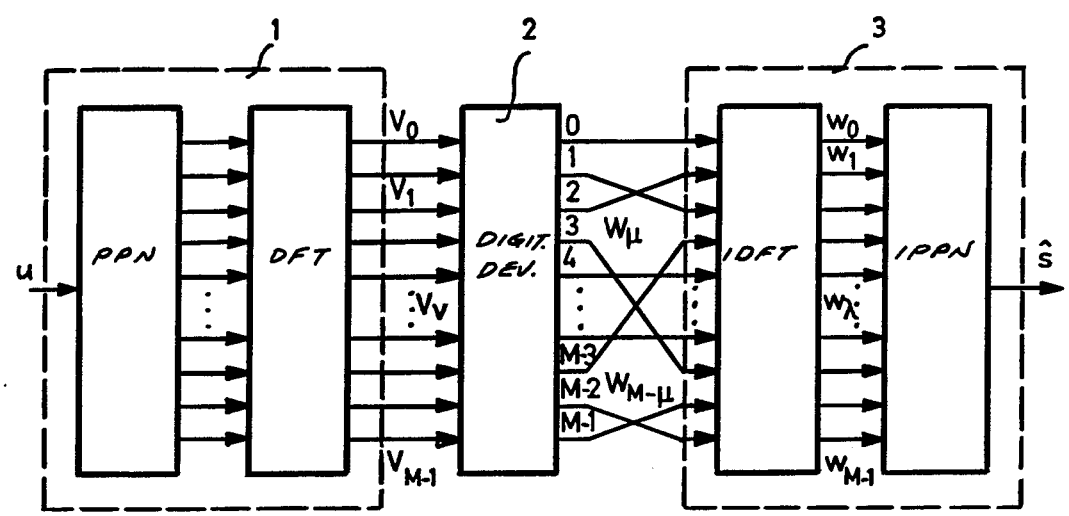
FIG. 4 is an embodiment of the digital filtering device according to this invention, for use in speech masking.

FIG. 4 depicts the application of the digital filtering device of this invention for masking signals. Devices are known for masked transmission of speech signals (for example from German Pat. No. 1 273 002) in which the speech frequency band is divided into a plurality of component bands of equal width, and these component bands are interchanged. For the exchange of the component bands it is possible to use a band switchover method. In this method an exchanger selects n modulators of a number 2n modulators to each of which a respective fixed carrier frequency is assigned.

By means of the digital filtering arrangement according to FIG. 4 it is possible to mask signals by the interchange and/or inversion of the frequency bands. The complex low-pass signals $V_\nu$ from the output of the device 1 in FIG. 4 are first applied into the device 2 for reducing noise in the manner explained in connection with FIG. 1. The complex time signals $W_\nu$ from the individual outputs of the device 2 are staggered or distributed according to their frequencies. The inversion of $\nu^{th}$ band is effected through the interchange of signals $W_\nu$ and $W_{M-\nu}$ or through the sign reversal of the imaginary components of $W_\nu$ and $W_{M-\nu}$. The interchange of bands can be accomplished through exchanging time signals $W_\nu$ with $W_\mu$ and $W_{M-\nu}$ with $W_{M-\mu}$ whereby $\nu \neq \mu$. In FIG. 4 there is illustrated the interchange for the complex time signals $W_1$ with $W_2$ and the inversion of time signals $W_3$. It will also be noted that the noise reduction can be selectively performed before or after the signal masking.

Figure 5:
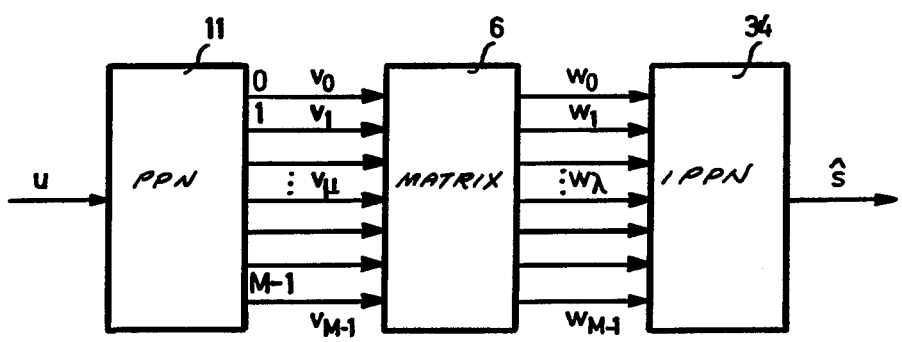
FIG. 5 is a modification of the digital filtering device of FIG. 4.

FIG. 5 shows a further embodiment of the digital filtering device for the signal masking. The preparation and arrangement of the complex time signals $W_\nu$ can be represented by vector operations. In this manner it is possible to replace the method steps of DFT (discrete Fourier transformation), processing, coordination and inverse FFT by a multiplicative combination in a matrix 6. A vector v the components of which are the filtered component signals $v_0, v_1, \ldots, v_{M-1}$ is transformed according to the equation $$\underline{W} = \underline{A} \cdot \underline{v} \qquad (15)$$

into a vector w with components $w_0, w_1, \ldots, w_{M-1}$.

The different kinds of signal preparation, such as for example filtering, signal improvement (with or without a reference), echo or feedback cancellation, can be realized simultaneously or in an arbitrary combination by means of the digital filtering devices of FIGS. 3 and 4.

If for example it is desired to obtain simultaneously a feedback cancellation and a signal improvement, then in the device according to FIG. 3 the signals G and V are either first added and then applied to the device 3 or else for this purpose a plurality of mutually separated devices 4 can be provided.

It will be understood that each of the elements described above, or two or more together, may also find a useful application in other types of constructions differing from the types described above.

While the invention has been illustrated and described as embodied in specific examples of the preparation of electrical signals, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

I claim:

1. A method of cancelling echo in speech frequency electrical signals by a digital filtering arrangement, comprising the steps of applying at least one input signal u to a polyphase network to produce intermediate output signals $V_\nu$, subjecting the intermediate output signals to a discrete Fourier transformation to produce spectral partial signals $V_\nu$ having separated real and imaginary components, processing the spectral partial signals $V_\nu$ by an adaptive level control to produce at outputs of the digital filtering arrangement complex time signals $W_\nu$ which meet the equation $$W_\nu(p) = c_\nu(p) \cdot V_\nu(p),$$

wherein $c_\nu$ is a level factor determined during speech pauses
as a function of momentary signal expectation values E1 and E2 and of the spectral partial signals $V_\nu$ according to the equation $$c_\nu = \sqrt{1 - a_o \cdot \frac{E_1\{|N_\nu|^2\}}{E_2\{|V_\nu|^2\}}} \;;$$

or $$c_\nu = 1 - \sqrt{a_o \cdot \frac{E_1\{|N_\nu|^2\}}{E_2\{|V_\nu|^2\}}} \;;$$

where $N_\nu$ are interference components, and interpolating the processed signals $W_\nu$ in an output signal $\hat{S}$, the interpolation step including inverse, discrete Fourier transformation and inverse polyphase filtering in a polyphase network.

2. A method as defined in claim 1 wherein momentary expectation values of spectral partial signals $V_\nu$ are used for determining said level factor $C_\nu(\rho)$.

3. A method as defined in claim 1 wherein at least one input signal u is used as a reference signal for determining said level factor $c_\nu(\rho)$.

4. A method as defined in claim 1 wherein for the purpose of speech signal masking, conjugate bands of said complex time signals $W_\nu$ are interchanged and simultaneously subjected to said interpolation step.

5. A method as defined in claim 1 wherein for the purpose of speech signal masking, signs of imaginary components of said complex time signals $W_\nu$ are reversed.

6. A method as defined in claim 1 wherein the spectral partial signals $V_\nu$ are processed by any combination of an adaptive level control and/or filtering and/or echo cancellation to produce the processed signals $W_\nu$ suitable for filtering, signal improvement, echo cancellation and/or signal masking of said at least one input signal.

* * * * *